United States Patent [19]

Eash

[11] Patent Number: 4,833,409
[45] Date of Patent: May 23, 1989

[54] APPARATUS FOR DYNAMICALLY DISABLING AN NMR FIELD COIL

[75] Inventor: Matthew G. Eash, Oconomowoc, Wis.

[73] Assignee: General Electric Company, Milwaukee, Wis.

[21] Appl. No.: 135,975

[22] Filed: Dec. 21, 1987

[51] Int. Cl.⁴ ............................................. G01R 33/20
[52] U.S. Cl. ...................................... 324/318; 324/322
[58] Field of Search ................ 324/307, 309, 311, 318, 324/320, 322; 335/299

[56] References Cited

U.S. PATENT DOCUMENTS

| | | | |
|---|---|---|---|
| 4,408,162 | 10/1983 | Egger | 324/318 |
| 4,620,155 | 10/1986 | Edelstein | 324/322 |
| 4,636,730 | 1/1987 | Bottomley | 324/318 |
| 4,642,569 | 2/1987 | Hayes et al. | 324/318 |
| 4,649,348 | 3/1987 | Flugan | 324/318 |
| 4,680,548 | 7/1987 | Edelstein et al. | 324/318 |
| 4,684,895 | 8/1987 | Misic | 324/322 |
| 4,686,473 | 8/1987 | Chesneau et al. | 324/318 |
| 4,692,705 | 9/1987 | Hayes | 324/318 |
| 4,694,255 | 9/1987 | Hayes | 324/318 |
| 4,728,896 | 3/1988 | Bendall et al. | 324/318 |
| 4,736,161 | 4/1988 | Prevot et al. | 324/318 |
| 4,737,718 | 4/1988 | Kemner et al. | 324/322 |
| 4,740,752 | 4/1988 | Arakawa et al. | 324/318 |
| 4,763,076 | 8/1988 | Arakawa et al. | 324/322 |

Primary Examiner—Stewart J. Levy
Assistant Examiner—Kevin D. O'Shea
Attorney, Agent, or Firm—Quarles & Brady

[57] ABSTRACT

A detunable coil assembly for an NMR imaging system has a cylindrical cage coil comprising two spaced-apart conductive end loops with a plurality of conductive segments extending between the loops. A grounded shield is disposed around the cage coil. Each of the end loops is coupled to the shield by four switchable impedance circuits that are equidistantly spaced around the loop. Each impedance means includes a coaxial cable having a length equal to one-quarter the wavelength of the resonant frequency of the cage coil with the central conductor coupled at one end to the cage coil and the other conductor connected to the shield. A PIN diode terminates the other end of the coaxial cable. A voltage supply provides potentials for alternately forward and reverse biasing the PIN diode.

11 Claims, 1 Drawing Sheet

APPARATUS FOR DYNAMICALLY DISABLING AN NMR FIELD COIL

BACKGROUND OF THE INVENTION

The field of the invention is nuclear magnetic resonance imaging methods and systems. More particularly, the present invention relates to a resonant coil which is enabled to create a radio frequency magnetic field excitation pulse and which is then disabled to allow another localized coil to receive the NMR signals.

Any atomic nucleus which possess a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant q of the nucleus). Nuclei which exhibit this phenomena are referred to herein as "spins". When a substance such as human tissue is subjected to a uniform static magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (radio frequency excitation field $B_1$) which is in the x-y plane and which is at the Larmor frequency, the net aligned moment, $M_z$, may be rotated, or "tipped", into the x-y plane to produce a net transverse magnetic moment M, which is rotating, or spinning, in the x-y plane at the Larmor frequency. The degree to which the net magnetic moment $M_z$ is tipped and, hence, the magnitude of the net transverse magnetic moment $M_1$ depends primarily on the length of time and magnitude of the applied RF excitation field $B_1$.

The practical value of this phenomenon resides in the signal which is emitted by the excited spins after the RF excitation signal $B_1$ is terminated. In simple systems the excited spins induce an oscillating sine wave signal in the receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t, according to the equation:

$$A = A_0 e^{t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the RF excitation signal $B_1$ in a perfectly homogeneous field.

Another important factor which contribute to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$.

The NMR measurements of particular relevance to the present invention are called "pulse NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude and duration. Such RF excitation pulses may have a narrow frequency spectrum (selective excitation pulse), or they may have a broad frequency spectrum (nonselective excitation pulse) which produces transverse magnetization $M_1$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is subjected to a sequence of NMR measurement cycles which vary according to the particular localization method being used. The received NMR signals are digitized and processed to reconstruct the image using one of many well known reconstruction techniques. To perform such a scan, it is of course, necessary to elicit NMR signals from specific locations in the subject. This is accomplished by employing magnetic fields ($G_X$, $G_Y$, and $G_Z$) which have the same direction as the polarizing field $B_0$, but which have a gradient along the respective x, y, and z axis. By controlling the strength of these gradients during each NMR cycle, the spatial distribution of spin excitation can be controlled and the location of the NMR signals can be identified.

NMR has rapidly developed into an imaging modality which is utilized to obtain tomographic, projection and volumetric images of anatomical features of live human subjects. Such images depict the nuclear-spin distribution (typically protons associated with water and fat), modified by specific NMR properties of tissues, such as spin-lattice ($T_1$), an spin-spin ($T_2$) relaxation time constants. They are of medical diagnostic value because they depict anatomy and allow tissue characterization.

There are a number of techniques employed to produce the RF excitation field ($B_1$) and to receive the NMR signal. It is quite common to employ separate, specially designed excitation and receiver coils. In many applications, the excitation is provided by a large body coil which is capable of handling large amounts of RF power to provide a homogeneous RF magnetic field throughout a large region. A smaller "surface" coil is then used to receive the NMR signals from a localized portion of the subject. For example, different surface coils may be employed for imaging the head and neck, legs and arms, or various internal organs of the patient. The surface coil provides relatively high sensitivity to the transmitted or received NMR signals throughout the region of interest.

As noted above, tee excitation signal and the signal to be received are both at the Larmor frequency. As a consequence, both the excitation coil and the receiving coil must be tuned to resonate at this frequency. A difficulty occurs when using two coils tuned to the same frequency in the same region, since the two coils will interact. This causes nonuniformity in the excitation field, frequency and impedance shifts in both coils and a degraded signal in the surface coil.

SUMMARY OF THE INVENTION

According to the present invention, an NMR radio frequency-field coil is partially surrounded by a grounded shield. The coil comprises two conductive end loops disposed along a central axis with a plurality of conductive segments extending periodically between the two end loops. The conductive segments include reactive elements which have values that cause the coil to resonate at a given radio frequency.

A switchable impedance circuit is connected between each of the conductive end loops and the grounded shield. By varying the impedance of this circuit, the field coil can be detuned from its resonant frequency. During the operation of the coil in an NMR imaging system, the circuit presents a high impedance path between each of the end loops and ground permitting the coil to resonate at the given frequency. The coil in this state is energized to create the excitation field for NMR imaging. When the NMR imaging system is placed in the receive mode, the circuit is switched to present a low impedance path between the coil and ground. This low impedance path detunes the coil from the given frequency enabling other coils in the imaging system to produce localized excitation or to pickup emissions from the subject being imaged without interaction from the field coil.

An object of the present invention is to provide a means for selectively detuning an RF field coil of an NMR imaging system.

Another object is to provide such detuning means which is capable of rapidly switching the coil between tuned and detuned states. It is also the intent of the present invention to accomplish the switching with a relatively low voltage switching signal as compared to the voltage of the RF signal.

Yet another object is to provide a coil detuning circuit that can withstand high power excitation signals that are either applied directly to the coil or induced in the coil by the excitation of an adjacent coil.

DETAILED DESCRIPTION OF THE INVENTION

Figure 1:
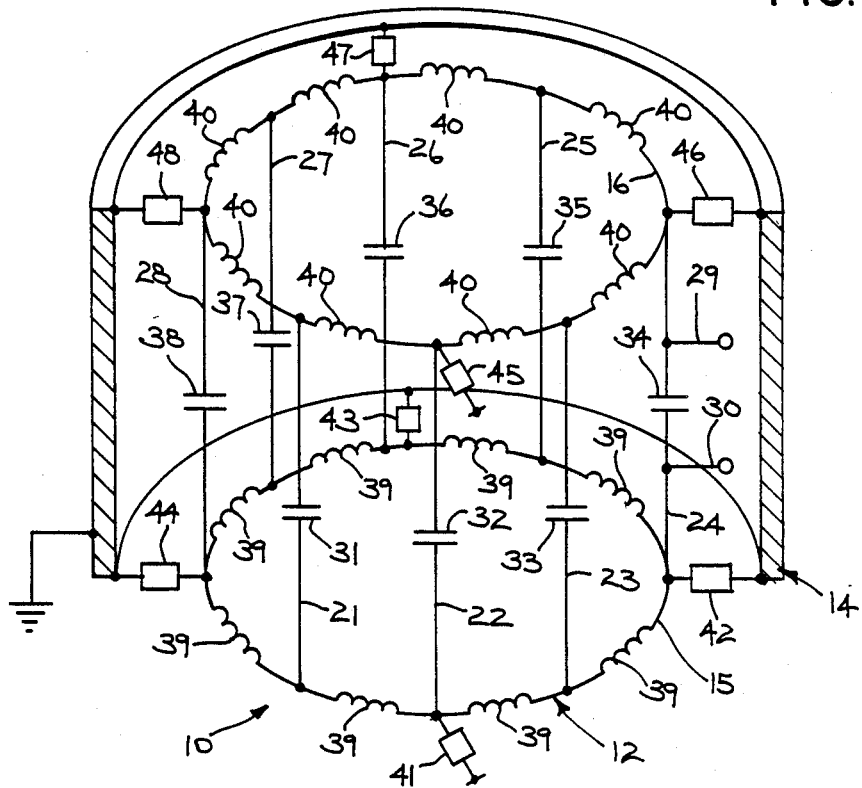
FIG. 1 is a schematic diagram of an NMR coil assembly according to the present invention.

With reference to FIG. 1, an NMR imaging system coil assembly 10 includes an excitation field coil 12 and a shield 14. The shield is a grounded tubular conductive element that surrounds the field coil 12 and other coils (not shown) as in a conventional NMR imaging system. The shield 14 acts to contain the magnetic field from the field coil 12. The field coil has two conductive end loops 15 and 16 spaced apart along a common central axis. The two end loops 15 and 16 are interconnected by eight axial conductive segments 21-28, forming a coil structure that resembles a cylindrical cage. Although the exemplary field coil 12 has eight conducive segments, the present invention can be utilized with cage type coils having a greater or a lesser number of segments. Field coils of this type are described in detail in U.S. Pat. No. 4,680,548, which description is incorporated herein.

Each of the conductive segments 21-28 is provided with at least one reactive element represented by a capacitor 31-38, respectively. Each of the conductive end loops 15 and 16 in the exemplary coil has one of eight serially connected inductive elements in each section of the loop between adjacent conductor segments 21-28. The inductive elements, designated 39 in the first end loop 15 and 40 in the second end loop 16, represent the distributed inductances inherent in the conductors of each loop. These inductances are needed to achieve the desired phase shifts for proper coil operation. The conductive segments 21-28 have similar distributed inductances associated with them, however these are not depicted in FIG. 1. In general, the inductances associated with the conductive segments 21-28 represent a smaller effect than the capacitive effect associated with each segment's discrete capacitors 31-38. The particular type of cage type field coil illustrated in FIG. 1 is referred to as "low pass" because lower signal frequencies will pass through the end loop inductive elements while higher frequencies will be blocked by the inductive elements 39 and 40 and shunted through the capacitors 31-38. The present invention can be utilized with the other types of coils, such as high pass coils, described in the aforementioned U.S. patent.

The field coil 12 is excited by radio frequency (RF) energy applied via leads 29 and 30 across the capacitor of one of the conductive segments, such as capacitor 34. For example, the excitation frequency of an NMR system for medical applications is approximately 64 Mhz, the Larmor frequency of protons in a 1.5 Tesla $B_0$ field. The field coil 12 is designed to resonate at this excitation frequency in two orthogonal modes.

Each of the conductive end loops 15 and 16 is coupled to the shield 14 by four switchable impedance circuits 41-44 for the first loop 15 and circuits 45-48 for the second loop 16. The four impedance circuits for each end loop 15 and 16 are equidistantly spaced about the loop. The eight impedance circuits 41-48 coupled to the field coil 12 are switched in unison to provide either a high or a low impedance path between the coil and the shield 14.

Figure 2:
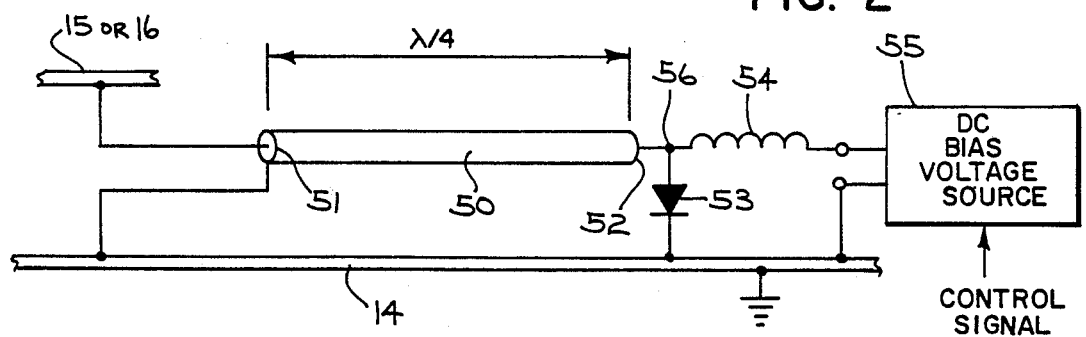
FIG. 2 is a diagram of a switchable impedance circuit employed in the FIG. 1 assembly.

The preferred embodiment of each of these impedance circuits 41-48 is shown in FIG. 2. The circuit includes a coaxial cable 50 having a length equal to one-quarter the wavelength ($\lambda$) of the resonant frequency of the field coil 12. Alternatively, the cable 50 can have a length equal to any odd integer multiple of one-quarter the wavelength of the resonant frequency (i.e. $\lambda/4$, $3\lambda/4$, $5\lambda/4$, etc.). The coaxial cable 50 has a characteristic impedance greater than 50 ohms, with 75 ohms being the nominal impedance. The center conductor of the cable 50 is directly connected at a first end 51 to the corresponding coil end loop 15 or 16. The outer coaxial conductor at the first end 51 is connected to the shield 14.

At the second end 52 of the coaxial cable 50, the center conductor is connected at node 56 to the anode of a PIN diode 53. The cathode of the PIN diode 5 is connected to the shield 14. The anode of the PIN diode 53 is also coupled by an RF choke 54 to a switchable source 55 of a dc bias voltage. In response to a signal from the NMR system control circuit, the voltage source 55 applies either a positive or a negative voltage to node 56 with respect to ground. At the resonant frequency of the field coil 12, the PIN diode acts like a variable resistor with its resistance controlled by the dc bias voltage. When the PIN diode 53 is forward biased by the dc voltage source 55, the impedance between node 56 and the shield 14 becomes very small, for example less than one-quarter of an ohm. This small impedance approximates a short circuit termination of the second end 52 of the cable 50. When the PIN diode 53 is reversed biased by the dc voltage source 55, the impedance between node 56 and the shield becomes relatively large, for example greater than 2000 ohms, in comparison to the resistance when it is forward biased. This state of the PIN diode approximates the effects of an open circuit termination of the second end 52 of the cable 50.

During the operation of the NMR imaging system incorporating the coil assembly 10, when the field coil 12 is to be energized to produce the excitation RF magnetic field, the PIN diode 53 is forward biased to create a virtual short circuit between node 56 and the shield 14. This is accomplished by the dc voltage source 55 applying a positive one volt potential to node 56 with respect to the shield 14. The quarter wavelength long coaxial cable 50 acts as an impedance inverter whereby the impedance $Z_1$ across the first end 51 of the cable 50 is given by:

$$Z_1 = \frac{Z_0^2}{Z_2}$$

whereby $Z_0$ is the characteristic impedance of the coaxial cable and $Z_2$ is the impedance between node 56 and the shield 14 due to the biasing of the PIN diode 53. Standing waves are developed in the coaxial cable 50, thereby inverting the short circuit impedance at the second end 52 to appear as an open circuit, or high impedance, at the first end 51. In this state, a high impedance at the resonant frequency exists between the field coil 12 and the shield 14. This enables the field coil 12 to resonate at the excitation frequency to produce the desired magnetic excitation of the subject being imaged by the NMR system. The high impedance results in the impedance circuits 41-48 having a negligible affect on the operation of the coil assembly 10.

When the field coil excitation portion of the NMR imaging cycle is complete, the RF excitation signal is no longer applied to terminals 29 and 30. At the same time, a negative dc bias is applied from the voltage source 55 to each of the impedance circuits 41-48 to reverse bias the PIN diodes 53. The magnitude of the necessary reverse bias voltage depends upon the voltages induced in the field coil 112 by other coils of the NMR system. If the next portion of the NMR cycle is receiving the signals from the object being imaged, relatively small voltages will be induced. Therefore, a negative one volt potential applied to node 56 with respect to the shield 14 will be sufficient to maintain the PIN diodes 53 reverse biased. However, if during the next portion of the NMR cycle another coil is to produce an excitation field, voltages on the order of 100 to 300 volts or more may be induced in the field coil 12. In this case, the reverse bias applied to the PIN diode must be greater than this larger induced voltage in order to insure that the PIN diodes 53 will be maintained in a reverse biased state.

The reverse biasing of the PIN diodes creates a high impedance between node 56 and the shield 14 at the second end 52 of cable 50 for the resonant frequency. This high impedance at the second end 52 is inverted to appear as a very low impedance at the first end 51 of the cable for the resonant frequency. In this state, each of the impedance circuits 41-48 acts as a short circuit between the field coil 12 and the shield 14. These virtual short circuits detune the field coil 12 by diverting electric currents to the shield 14, so that the coil no longer resonates at the excitation frequency. This detuning enables a conventional surface coil to receive the Larmor signal from the subject being imaged without the two coils and their magnetic fields interacting.

Figure 3:
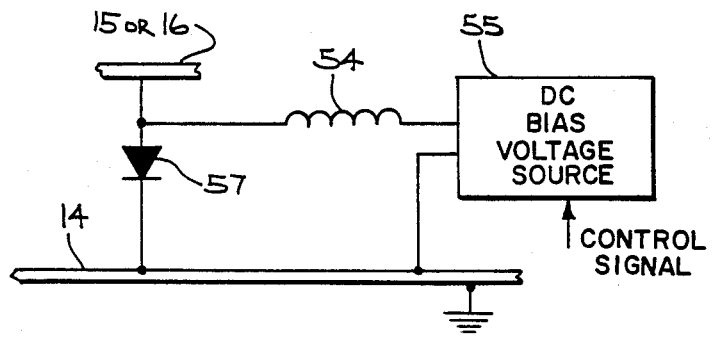
FIG. 3 is a diagram of an alternative switchable impedance circuit.

Alternatively, other types of switches can be used for the switchable impedance circuits 41-48. In a basic alternative, shown in FIG. 3, the impedance inverter is eliminated by connecting the PIN diode 57 directly between the field coil 15 or 16 and the grounded shield 14. In this design, the PIN diode 57 is reverse biased when the coil is excited. In this embodiment, the reverse bias voltage applied to the PIN diode must be at least as great as the potential of the excitation signal. Therefore, this reverse bias voltage mutt be significantly greater than the reverse bias voltage applied to the previous embodiment which incorporated an impedance inverter. In some NMR applications, the excitation potential is greater than the reverse breakdown voltage of presently available PIN diodes, making the latter embodiment impractical.

In the NMR system, for which the present invention was developed, an impedance circuit switching time on the order of tens of microseconds is required. However, in systems or applications where such short switching time is not required, electromechanically activated switches can be employed.

Various coil assemblies can be constructed according to the principles of the present invention. The novel detuning circuits can be incorporated into the different coils disclosed in the aforementioned patent. The number of switchable impedance circuits coupled between the field coil and ground can also vary to provide the desired degree of detuning. In addition, as noted above, different types of these circuits can also be employed.

I claim:

1. A radio frequency NMR coil assembly comprising:
   a cylindrical field coil having a pair of conductive loop elements disposed in a space-apart relation along a central axis, and a plurality of conductive segments electrically interconnecting the pair of conductive loop elements at periodic points around each of said loop elements, and said conductive segments including reactive elements which cause the field coil to resonate at a given frequency; and
   means, coupled to said field coil, for switchably detuning the resonance of said field coil from the given frequency, said means including a plurality of impedance elements which couple each of said conductive loop elements to a reference voltage potential and which are switchable between two impedance values.

2. The NMR coil assembly as recited in claim 1 wherein each of said impedance elements includes an impedance inverter.

3. The NMR coil assembly as recited in claim 1 wherein each of said impedance elements includes:

a transmission medium having a length equal to approximately an odd integer multiple of one-quarter the wavelength of a signal at the given frequency, and coupled at one end to one of the conductive loop elements; and a switch means coupled to the other end of said transmission medium to alternately terminate the other end with either a relatively large impedance or a relatively small impedance.

4. The NMR coil assembly as recited in claim 1 wherein said shield is connected to ground potential and wherein said impedance elements couple each of said conductive loop elements to said shield.

5. The NMR coil assembly as recited in claim 4 wherein each of said impedance elements includes:

a coaxial cable having a length substantially equal to an odd integer multiple of one-quarter the wavelength of a signal at the given frequency, having a first conductor coupled at one end of said coaxial cable to one of the conductive loop elements, and having a second conductor coupled to said shield; and a switch means for selectively coupling the first conductor at the other end of said coaxial cable to said shield.

6. The NMR coil assembly as recited in claim 5 wherein said switch means of each of said impedance elements includes:

a PIN diode connected between the first conductor at the other end of said coaxial cable and said shield; and means for alternately forward and reverse biasing said PIN diode.

7. The NM coil assembly as recited in claim 4 wherein each of said impedance elements includes:

a coaxial cable having a length substantially equal to an odd integer multiple of one-quarter the wavelength of a signal at the given frequency, having a first conductor coupled at one end of said coaxial cable to one of the conductive loop elements, and having a second conductor coupled to said shield;

a switch means for selectively coupling the first conductor at the other end of said coaxial cable to the second conductor.

8. The NMR coil assembly as recited in claim 7 wherein said switch means of each of said impedance elements includes:

a PIN diode connected between the first conductor at the other end of said coaxial cable and said second conductor; and means for alternately forward and reverse biasing said PIN diode.

9. The NMR coil assembly as recited in claim 1 wherein there are four of said impedance elements coupled at substantially equidistant locations around each of the conductive loop elements.

10. The NMR imaging system as recited in claim 3 wherein the relatively large impedance is greater than 500 ohms and the relatively small impedance is less than one ohm.

11. A radio frequency NMR coil assembly comprising:

a cylindrical field coil having a pair of conductive loop elements disposed in a space-apart relation along a central axis, and a plurality of conductive segments electrically interconnecting the pair of conductive loop elements at periodic points around each of said loop elements, and said conductive segments including reactive elements which cause the field coil to resonate at a given frequency; and means, coupled to said field coil, for switchably detuning the resonance of said field coil from the given frequency.

* * * * *